United States Patent [19]

Hebenstreit et al.

[11] Patent Number: 5,060,048

[45] Date of Patent: Oct. 22, 1991

[54] SEMICONDUCTOR COMPONENT HAVING AT LEAST ONE POWER MOSFET

[75] Inventors: Ernst Hebenstreit, Munich; Leo Lorenz, Neubiberg; Winfried Schierz, Heideck; Heinz Amann, Unterhaching, all of Fed. Rep. of Germany

[73] Assignee: Siemens Aktiengesellschaft & Semikron GmbH, Berlin and Munich, Fed. Rep. of Germany

[21] Appl. No.: 520,958

[22] Filed: May 4, 1990

Related U.S. Application Data

[63] Continuation of Ser. No. 363,456, Jun. 6, 1989, abandoned, which is a continuation of Ser. No. 112,223, Oct. 22, 1987, abandoned.

[30] Foreign Application Priority Data

Oct. 22, 1986 [DE] Fed. Rep. of Germany ....... 3635956

[51] Int. Cl.$^5$ ...................... H01L 23/48; H01L 29/78; H01L 27/22
[52] U.S. Cl. ..................................... 357/68; 357/23.8; 357/27; 357/40; 357/45; 357/51; 357/65
[58] Field of Search ........................ 357/40, 45, 41, 46, 357/51, 23.8, 23.1, 65, 68, 27

[56] References Cited

U.S. PATENT DOCUMENTS

| | | | |
|---|---|---|---|
| 3,749,985 | 7/1973 | Dawson | 357/40 |
| 4,462,041 | 7/1984 | Glenn | 357/46 |
| 4,739,389 | 4/1988 | Goedblood | 357/41 |

FOREIGN PATENT DOCUMENTS

| | | |
|---|---|---|
| 0018091 | 10/1980 | European Pat. Off. . |
| 3327186 | 7/1983 | Fed. Rep. of Germany . |
| 61-216477 | 9/1986 | Japan ..................................... 357/40 |

OTHER PUBLICATIONS

Sedra et al., "Micro-Electronic Circuits", p. 306, copyright 1982.
Chapter 6: Paralleling Power MOSFETs-Motorola TMSO Power MOSFET Data A-49 through A71.
Advanced Design With Power MOSFETs by Rudy Severns-Controlling Oscillation in Parallel Power MOSFETs PCI, Oct. 1984, Proceedings 209-213.
Semiconductor Device—vol. 8, No. 123 (E-249) 1560, Jun. 8, 1984, Patent Abstracts of Japan.
Nov. 12, 1981, vol. 5, No. 176 (E81) 843 Transistor Array, Patent Abstracts of Japan.

Primary Examiner—Andrew J. James
Assistant Examiner—Ngan Van Ngo
Attorney, Agent, or Firm—Hill, Van Santen, Steadman & Simpson

[57] ABSTRACT

A discretely constructed MOSFET is switched by a voltage applied between gate terminal and source terminal. The source terminal has a self-inductance in which a fast change of the load current induces a considerable voltage which opposes the applied gate-source bias. This opposing voltage is reduced since the source contact is connected to an auxiliary terminal which is largely magnetically decoupled from the source terminal. A control voltage is applied between gate terminal and auxiliary terminal. When a plurality of MOSFETs are connected in parallel, oscillations in the control circuit can thus be effectively suppressed.

15 Claims, 2 Drawing Sheets

SEMICONDUCTOR COMPONENT HAVING AT LEAST ONE POWER MOSFET

This is a continuation of application Ser. No. 363,456, filed June 6, 1989, now abandoned, which is a continuation of application Ser. No. 112,223, filed Oct. 22, 1987, now abandoned.

BACKGROUND OF THE INVENTION

The invention is directed to a semiconductor component having at least one power MOSFET whose semiconductor body has a source contact and a source terminal connected thereto, and also has a gate contact and a gate terminal connected thereto.

Such semiconductor components are activated by a control voltage applied between the source contact and the gate contact. In practice, the control voltage is applied between the source terminal and the gate terminal. The wire serving as the source terminal has a self-inductance when the load changes in time-wise fashion given turn-on or turn-off of the MOSFET, a voltage is induced in the inductance which opposes the control voltage in a switch-retarding fashion. When a plurality of power MOSFETs are connected in parallel and they are controlled in common from a single voltage source, then the inductance can cause high frequency oscillations with amplitudes which can destroy the FET input. These oscillations occur in the drive circuit due to unavoidable component tolerances. The oscillation frequency is critically determined by the inductance of the source terminal and is also determined by other parasitic network and component parameters. The amplitude of the oscillation is amplified by the large transconductance of the MOSFET.

The oscillations upon turn-on of power MOSFETs connected in parallel were described, for example, in the publication "PCI October 1984 Proceedings" pages 209 through 213 and in the publication "MOTOROLA TMS POWER MOSFET DATA", pages A-49 through A-70. In order to prevent the high frequency oscillations, it is proposed to insert a respective resistor or a ferrite bead into the gate terminals of the MOSFETs connected in parallel. Tests, however, have shown that the described problems are in fact alleviated but cannot be completely eliminated when fast switching is to be undertaken.

SUMMARY OF THE INVENTION

An object of the invention is to improve a semiconductor component of the said above described type such that the disadvantageous effect of the inductance of the source terminal is further diminished and the oscillations are avoided in MOSFETs connected in parallel, even given fast switching on the order of magnitude of less than one microsecond.

This object is achieved by an auxiliary terminal connected to the source contact, this auxiliary terminal being at least partially magnetically decoupled from the source terminal.

DESCRIPTION OF THE PREFERRED EMBODIMENTS

Figure 1:
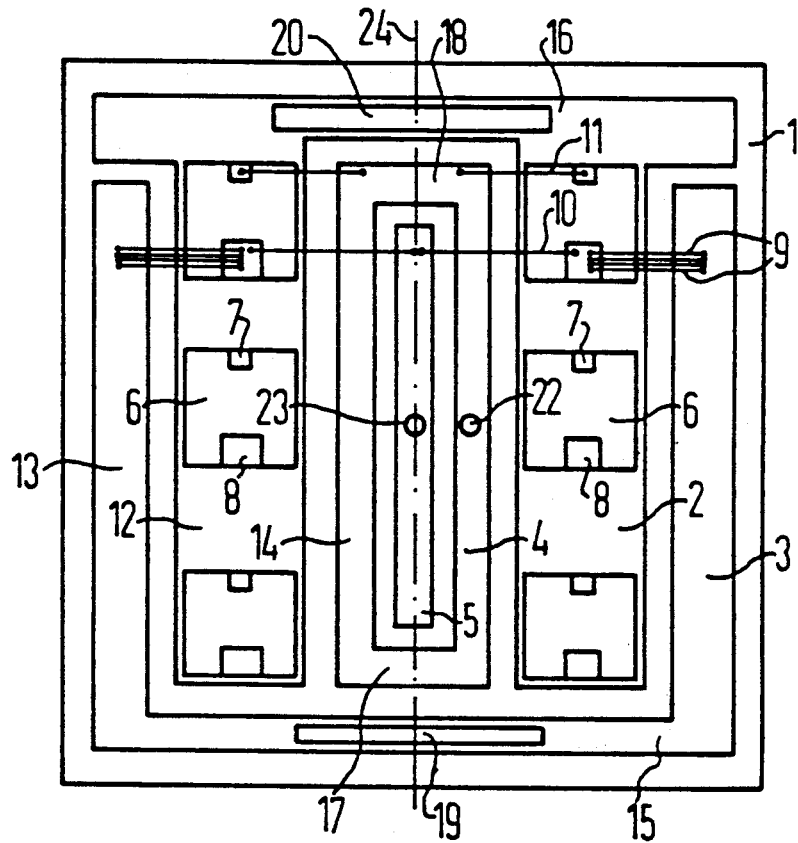
FIG. 1 is a plan view of the power MOSFET arrangement or the invention.

The semiconductor component of FIG. 1 is constructed on an insulating, heat-conducting substrate 1. The substrate, for example, can be formed of a known aluminum oxide ceramic. It is provided with first interconnects 2, 12, with second interconnects 3, 13, and with third interconnects 4, 14. These interconnects lie parallel to one another and are arranged in mirror-symmetric fashion relative to an axis 24 of symmetry forming a longitudinal axis of the substrate 1. The substrate is also provided with a fourth interconnect 5 which resides on the symmetry axis 24.

The first interconnects 2, 12 and second interconnects 3, 13 are conductively connected to one another by bridges 15 or 16. The third interconnects 4, 14 are electrically connected to one another by bridges 17, 18. Together with the bridge 16, the interconnects 2, 12 form a first U-shaped conductor, whereas the interconnects 3, 13 form a second U-shaped conductor with the bridge 15. The two U-shaped conductors are turned by 180° relative to one another and are arranged on the substrate in interleaved fashion.

Semiconductor bodies 6 which each form a power MOSFET are arranged in two rows following one another on the first interconnects 2, 12. The semiconductor bodies 6 are each provided with a gate contact 7 and with a source contact 8. The source contacts 8 are connected to the second interconnects 3, 13 via, for example, bonding wires 9. Together with the bridge 15 and the bonding wires 9, the interconnects 3, 13 form the source terminal. The gate contacts 7 are each connected to the third interconnects 4, 14 via one or more bonding wires 11. Together with the bridges 17, 18 and the bonding wires 11, these interconnects form the gate terminal of the semiconductor component. The interconnects 2, 12 serve as a drain terminal connecting to a drain of the semiconductor body 6.

In addition, the source contacts 8 are connected to the interconnect 5 via bonding wires 10. Together with the interconnect 5, the bonding wires 10 form an auxiliary terminal for the drawing of the MOSFETs connected in parallel. In order to keep the bonding wires short, they lie at a right angle relative to the interconnects.

The semiconductor component is switched on by a gate voltage applied between the gate terminal and the auxiliary terminal. Since the interconnects 3, 13, i.e. the source terminals, are arranged at the one side of the row of semiconductor bodies, (at the outside of the substrate in the exemplary embodiment), and the interconnects for the drive of the semiconductor bodies are arranged at the other side of the row of semiconductor bodies, a high degree of magnetic decoupling of the drive circuit from the source terminals of the semiconductor element results. Such a semiconductor component can become fully conductive within, for example, 100 ns without high-frequency oscillations arising in the drive circuit. With a given position of the interconnects, the magnetic decoupling is all the better the further the bonding wires 9 carrying the load current are spaced from the bonding wire 10. The arrangement is optimum when, as illustrated, the bonding wires 9 and 10 project from the source contact 8 at opposite sides.

A further improvement of the drive behavior can be achieved in that the conductor systems belonging to the control circuit and composed of the bonding wires 10, 11 and of the interconnects 4 or 14 are arranged in close proximity to one another and lie at least partially parallel to one another. The inductance of the control circuit can thus be diminished. The bonding wires and interconnects can be arranged in as close proximity as possible based on insulation and manufacture considerations.

In FIG. 1, the semiconductor bodies 6 are arranged on the interconnects 2, 12 such that the bonding wires 10 and 11 lie relatively far apart. In the exemplary embodiment of FIG. 2, the semiconductor bodies are turned by 90° in comparison to the exemplary embodiment of FIG. 1. A spatially adjacent arrangement of the bonding wires 10 and 11 belonging to the control circuit becomes possible when the source and gate contacts lie opposite one another at the edge of the semiconductor bodies.

The drain terminals, source terminals, and gate terminals as well as the auxiliary terminals are connected to housing terminals 19, 20, 22, and 23. Reference numeral 19 forms the source housing terminal, 20 forms the drain housing terminal, 22 forms the gate housing terminal, and 23 forms the auxiliary housing terminal These housing terminals lead out of a housing enveloping the substrate, the semiconductor bodies, the interconnects, and the bonding wires, and are intended for connection to external voltage sources or to an external load. The housing terminals 19, 20 lie symmetrically on the bridges 15 or 16 relative to the axis 24 of symmetry or, expressed in other terms, lie on the yokes of the U-shaped conductor systems. The housing terminals 22, 23 are seated in the middle of the longitudinal extent of the third or fourth interconnects. When the semiconductor bodies 6 are seated uniformly distributed on the interconnects 2, 12 relative thereto, then a largely uniform current division and uniform turn-on conditions are obtained for all MOSFETs.

Figure 2:
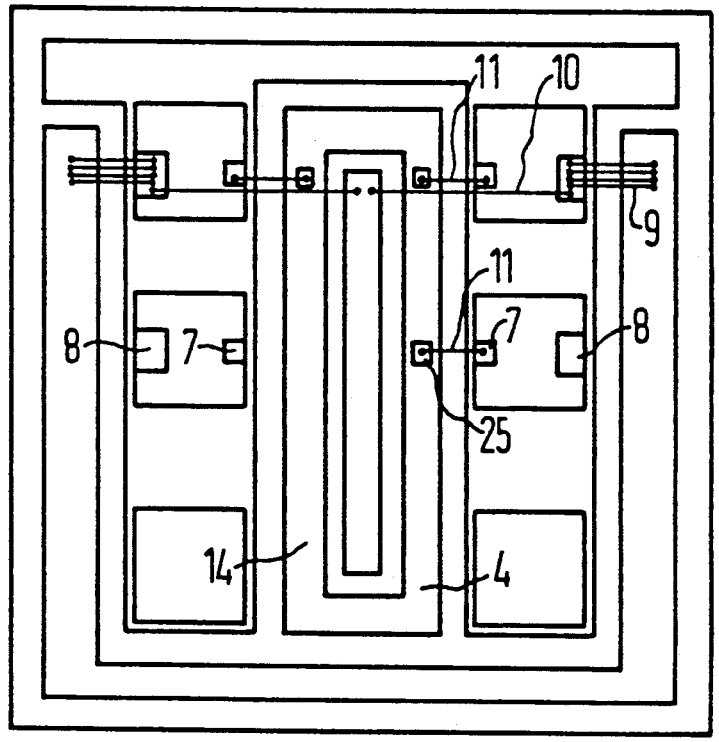
FIG. 2 is also an embodiment of the invention.

The exemplary embodiments of FIGS. 1 and 2 each comprise 6 semiconductor bodies. However, it is also possible to construct semiconductor components having fewer or more semiconductor bodies, preferably an even-numbered plurality of semiconductor bodies based on the same principle. It is also possible to construct semiconductor components according to the described principle which, for example, contain only a single arrangement lying at one side of the axis of symmetry. Moreover, it is conceivable to construct semiconductor components according to the illustrated principle which comprise only a single semiconductor body.

In a departure from the allocation of the U-shaped, first and second interconnects 2, 12, 3, 13 shown in FIGS. 1 and 2, these can also be interleaved with one another in the fashion of finger structures.

Figure 3:
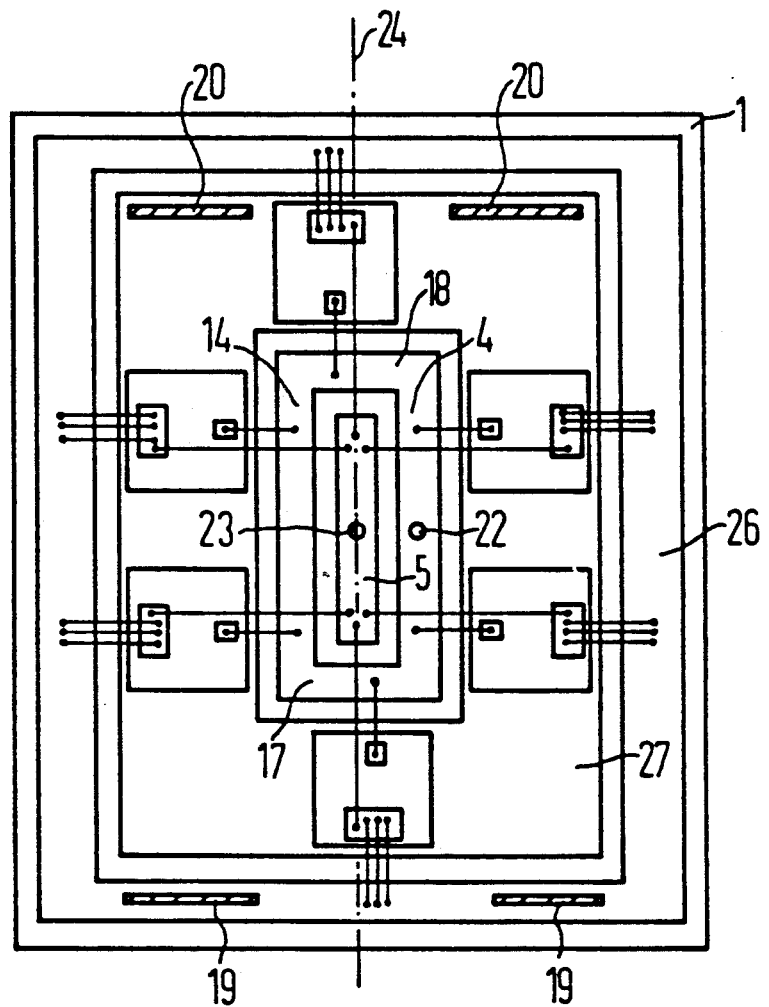
FIG. 3 is a plan view of a further embodiment of the invention.

FIG. 3 shows a further exemplary embodiment. There the first and the second interconnects are each also designed as closed rings 26 or 27, and are arranged lying inside one another. The third interconnects 4, 14, 17, 18 which likewise form a ring, lie in the ring 27. Two of the semiconductor bodies lie on the symmetry axis 24. The housing terminals 19, 20 have been divided here and contact the rings 26, 27 at both sides of these semiconductor bodies. They lie at a right angle and symmetrically to the symmetry axis 24.

For especially high demands, a resistor 25 (FIG. 2) may be inserted into the gate terminal of every semiconductor body in a known fashion. For example, such a resistor can be a doped semiconductor chip which is soldered onto the interconnects 4, 14. The bonding wire 11 then contacts the upper side of the chip.

Although the invention has been described with respect to preferred embodiments, it is not to be so limited as changes and modifications can be made which are within the full intended scope of the invention as defined by the appended claims.

We claim as our invention:

1. A semiconductor component, comprising:
   a substrate;
   a symmetry axis on the substrate;
   a first interconnect pair wherein one of the first interconnects is at one side of the symmetry axis and the other first interconnect is at the other side of the symmetry axis in mirror-symmetric fashion;
   MOSFETs arranged on each of the first interconnects such that a same number of MOSFETs is arranged on each of the first interconnects in mirror-symmetric fashion relative to the symmetry axis, drains of the MOSFETs connecting to the first interconnects;
   a pair of second interconnects with one of the second interconnects to one side of the symmetry axis and the other second interconnect being to the other side of the symmetry axis in mirror-symmetric fashion, and connection wires running from a source contact on each of the MOSFETs to the respective first second interconnect which is adjacent the respective MOSFET;
   a pair of third interconnects wherein one of the third interconnects lies between the symmetry axis and the MOSFETS at the one side of the symmetry axis and the other third interconnect lies between the symmetry axis and the other MOSFETs at the other side of the symmetry axis, and connection wires running from a gate on each of the MOSFETs to the third interconnect which is adjacent the respective MOSFET; and
   a fourth interconnect lying along the symmetry axis and connecting with connection wires to the source contacts of all of the MOSFETs, the connection wires being arranged in mirror-symmetric fashion relative to the symmetry axis; and
   the third and fourth interconnects forming input connections to the component.

2. A semiconductor component, comprising:
   at least one power MOSFET formed of a semiconductor body having a drain, a source contact, and a gate contact;
   a first interconnect, the semiconductor body being positioned on the first interconnect and the drain connecting to the first interconnect such that the first interconnect serves as a drain terminal;
   a second interconnect as a source terminal lying at one side of the first interconnect and being connected to the source contact;
   a third interconnect lying on an opposite side of the first interconnect such that the first interconnect lies between the second interconnect and third interconnect, said third interconnect connecting to the gate contact and serving as a gate terminal;
   a fourth interconnect lying alongside the third interconnect such that the third interconnect lies between the fourth interconnect and the first interconnect, said fourth interconnect serving as an auxiliary terminal also connected to the source contact; and
   an input of the component being applied between the gate terminal and auxiliary terminal of the third and fourth interconnects, whereby the input is decoupled from an output at the source terminal lying at the opposite one side of the first interconnect.

3. A component according to claim 2 wherein a plurality of said power MOSFETs are positioned on the first interconnect and are connected like the one MOSFET to the first, second, third, and fourth interconnects.

4. A semiconductor component according to claim 2 wherein an electrically insulating, thermally conductive substrate is provided with said first, second, third, and fourth interconnects thereon; a plurality of said semiconductor bodies being arranged in a row and following one another on the first interconnect; the second interconnect lying alongside the row and being electrically connected to the source contacts; the third interconnect lying alongside the row and being connected to the gate contacts; and the fourth interconnect lying alongside the row and being connected to the source contacts.

5. A semiconductor component according to claim 4 wherein the third and fourth interconnects are arranged directly adjacent one another and at least partially parallel to one another.

6. A semiconductor component according to claim 4 wherein the source and gate contacts of the semiconductor bodies are connected to the respective second and third interconnects via bonding wires.

7. A semiconductor component according to claim 6 wherein the bonding wires connected to the third and fourth interconnects are adjacent and parallel to one another.

8. A semiconductor component according to claim 6 wherein the bonding wires extend at a right angle relative to a longitudinal extent of the interconnects.

9. A semiconductor component according to claim 4 wherein pairs of said first, second, and third interconnects are arranged by the substrate such that relative to a symmetry axis, one of the interconnects of each pair lies on one side of the symmetry axis and the other interconnect of the pair lies on the opposite side of the symmetry axis so that a mirror symmetry is formed by the interconnects relative to the symmetry axis; the semiconductor bodies being arranged at both sides of the symmetry axis in mirror symmetrical fashion on the first interconnects; the fourth interconnect lying on the symmetry axis; and the connection from the first, second, and third interconnects to the respective contacts on the semiconductor bodies being mirror symmetric relative to the symmetry axis.

10. A semiconductor component according to claim 9 wherein the first and second interconnects each being U-shaped and arranged interleaved within one another and oriented 180° relative to one another; the third interconnect being a closed, rectangular ring and lying inside the U-shaped second interconnect; and the fourth interconnect being a strip and lying inside the rectangular ring.

11. A semiconductor component according to claim 10 wherein the drain terminal, source terminal, gate terminal, and auxiliary terminal are housing terminals; the housing terminals for the first and second interconnects lying symmetrical relative to the symmetry axis on yoke portions of the U-shaped first and second interconnects; and the housing terminals for the third and fourth interconnects lying at least approximately in a middle of a longitudinal extent thereof.

12. A semiconductor component according to claim 4 wherein a resistor is connected to the gate terminal.

13. A semiconductor component according to claim 9 wherein the first, second and third interconnect pairs each form closed rings and are arranged inside one another; and the fourth interconnect lying strip-shaped inside an innermost one of the rings.

14. A semiconductor component according to claim 13 wherein the terminals for the first and second interconnects lie perpendicular and symmetrical to the symmetry axis; and the terminals for the third and fourth interconnects lie at least approximately in a middle of a longitudinal extent of said third and fourth interconnects.

15. A semiconductor component, comprising:
at least one power MOSFET formed of a semiconductor body having a drain, a source contact, and a gate contact;
a first interconnect, the semiconductor body being positioned at the first interconnect and the drain connecting to the first interconnect such that the first interconnect serves as a drain terminal;
a second interconnect as a source terminal lying at one side of the first interconnect and being connected to the source contact;
a third interconnect lying on an opposite side of the first interconnect such that the first interconnect lies between the second interconnect and the third interconnect, said third interconnect connecting to the gate contact and serving as a gate terminal;
a fourth interconnect lying alongside the third interconnect such that the third interconnect lies between the fourth interconnect and the first interconnect, said fourth interconnect serving as an auxiliary terminal also connected to the source contact; and
an input of the component being applied between the gate terminal and auxiliary terminal of the third and fourth interconnects, whereby the input is decoupled from an output at the source terminal lying at the opposite one side of the first interconnect.

* * * * *